(12) United States Patent
Matsumoto

(10) Patent No.: US 8,439,051 B2
(45) Date of Patent: May 14, 2013

(54) METHOD OF SUBSTRATE PROCESSING, SUBSTRATE PROCESSING SYSTEM, AND STORAGE MEDIUM

(75) Inventor: Kazuhisa Matsumoto, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 666 days.

(21) Appl. No.: 12/083,466

(22) PCT Filed: Apr. 12, 2007

(86) PCT No.: PCT/JP2007/058070
§ 371 (c)(1),
(2), (4) Date: Apr. 11, 2008

(87) PCT Pub. No.: WO2007/132609
PCT Pub. Date: Nov. 22, 2007

(65) Prior Publication Data
US 2009/0114253 A1   May 7, 2009

(30) Foreign Application Priority Data

May 15, 2006   (JP) .................................. 2006-135489

(51) Int. Cl.
*B08B 3/00*   (2006.01)
(52) U.S. Cl.
USPC ............. 134/95.2; 134/30; 134/26; 134/95.1; 134/94.1; 134/103.2; 134/198
(58) Field of Classification Search ............... 134/26, 134/30, 95.1, 95.2, 94.1, 103.2, 198
See application file for complete search history.

(56) References Cited

U.S. PATENT DOCUMENTS 5,024,744 A * 6/1991 Okabayashi .................. 204/194
5,718,763 A * 2/1998 Tateyama et al. ............... 118/52

(Continued)

FOREIGN PATENT DOCUMENTS

| JP | 10-22204 | 1/1998 |
| JP | 11-74179 | 3/1999 |

(Continued)

OTHER PUBLICATIONS

PCT Notification of Transmittal of Translation of the International Preliminary Examination Report (Form PCT/IB/338) dated Jan. 2004.

(Continued)

*Primary Examiner* — Michael Kornakov
*Assistant Examiner* — Katelyn Whatley
(74) *Attorney, Agent, or Firm* — Burr & Brown

(57) ABSTRACT

The present invention provides a substrate processing system in which a processing liquid is supplied to a substrate W from a processing nozzle 50a situated above the substrate W so as to process the substrate W, and which makes it possible to prevent unintended dripping of the processing liquid from the processing nozzle. A substrate processing system 20 comprises a processing nozzle 50a capable of supplying a processing liquid to a substrate to be processed, an arm 54 supporting the processing nozzle, and droplet removing nozzles 60, 62 capable of blowing a gas to the processing nozzle. The arm is movable between a processing position and a waiting position, the processing nozzle being above a substrate when the arm is in the waiting position and being outside a substrate when the arm is in the processing position. The droplet removing nozzles are so situated that they are in the vicinity of the processing nozzle when the arm is in the waiting position.

6 Claims, 11 Drawing Sheets

U.S. PATENT DOCUMENTS

| | | | |
|---|---|---|---|
| 6,210,481 B1* | 4/2001 | Sakai et al. | 118/697 |
| 6,371,667 B1* | 4/2002 | Kitano et al. | 396/611 |
| 7,267,723 B2* | 9/2007 | Goto et al. | 118/302 |
| 2001/0003966 A1* | 6/2001 | Kitano et al. | 118/70 |
| 2002/0035762 A1* | 3/2002 | Okuda et al. | 15/77 |
| 2002/0053355 A1* | 5/2002 | Kamikawa et al. | 134/30 |
| 2003/0159718 A1* | 8/2003 | Kamikawa et al. | 134/30 |
| 2004/0213913 A1* | 10/2004 | Jung et al. | 427/420 |
| 2005/0022325 A1* | 2/2005 | Uemukai et al. | 15/77 |

FOREIGN PATENT DOCUMENTS

| | | |
|---|---|---|
| JP | 2001-232250 | 8/2001 |
| JP | 2003-168670 | 6/2003 |
| JP | 2004-273799 | 9/2004 |

OTHER PUBLICATIONS

PCT International Preliminary Report on Patentability (Form PCT/IB/373) dated Jan. 2004.

PCT Written Opinion of the International Searching Authority (Form/ISA/237) dated Apr. 2005.

PCT Second and Supplementary Notice Informing the Applicant of the Communication of the International Application (to designated offices which apply the 30 month time limit under article 22 (1)) (Form PCT/IB/308) dated Jan. 2004.

* cited by examiner

METHOD OF SUBSTRATE PROCESSING, SUBSTRATE PROCESSING SYSTEM, AND STORAGE MEDIUM

BACKGROUND OF THE INVENTION

1. Field of the Invention

The present invention relates to a system and a method in which a processing liquid is supplied to a substrate from a processing nozzle situated above the substrate to process the substrate, and particularly to a substrate processing system and a method of substrate processing that make it possible to prevent unintended dripping of a processing liquid from a processing nozzle.

The present invention also relates to a program storage medium in which is stored a program for executing a method of substrate processing in which a processing liquid is supplied to a substrate from a processing nozzle situated above the substrate to process the substrate, the method being advantageous in that the method makes it possible to prevent unintended dripping of the processing liquid from the processing nozzle.

2. Description of Related Art

There have so far been known a system and a method in which a processing liquid is supplied to a substrate from a processing nozzle situated above the substrate to process the substrate.

Further, there have also been proposed recently a system and a method in which a two-fluid nozzle is used as a processing nozzle to jet a mixture of a processing liquid and a gas to a substrate so as to clean the substrate (e.g., Japanese Laid-Open Patent Publication No. 168670/2003). If a two-fluid nozzle is used, there can be obtained not only the chemical cleaning action of a processing liquid, but also the physical cleaning action produced by a collision pressure created by the collision of fluids with a substrate. An excellent cleaning effect can therefore be expected from such a substrate cleaning system.

In the above-described substrate processing, a processing liquid sometimes drips unfavorably from a processing nozzle and from a surrounding of the processing nozzle on a substrate when the substrate is processed after processing the previous one.

Such dripping of a processing liquid readily occurs particularly in a substrate processing system using a two-fluid nozzle as the processing nozzle. The first reason for this is that the processing liquid collides with a substrate and curls up so as to produce droplets, which are apt to stick to the processing nozzle and to the surrounding of the processing nozzle. The second reason is as follows: in order to meet the strong demand for a smaller-sized substrate processing system in recent years, a processing nozzle and a substrate to be processed have come to be positioned more closely to each other than ever; consequently, the droplets of the processing liquid, which have collided with the substrate and have curled up, reach to and stick to the processing nozzle and the surrounding of the processing nozzle more frequently.

If such droplets of a processing liquid fall on a substrate, the substrate may unfavorably have water marks.

SUMMARY OF THE INVENTION

In the light of the above-described drawbacks in the prior art, the present invention was accomplished. An object of the present invention is therefore to provide a substrate processing system and a method of substrate processing in which a processing liquid is supplied to a substrate from a processing nozzle situated above the substrate to process the substrate, and that make it possible to prevent unintended dripping of the processing liquid from the processing nozzle.

Another object of the present invention is to provide a program storage medium in which is stored a program for executing a method of substrate processing in which a processing liquid is supplied to a substrate from a processing nozzle situated above the substrate to process the substrate, the method being advantageous in that the method makes it possible to prevent unintended dripping of the processing liquid from the processing nozzle.

A substrate processing system according to the present invention comprises a processing nozzle capable of supplying a processing liquid to a substrate to be processed, an arm supporting the processing nozzle, the arm being movable between a processing position and a waiting position, the processing nozzle being above the substrate when the arm is in the processing position and being outside the substrate when the arm is in the waiting position, and a nozzle capable of blowing a gas to the processing nozzle, the nozzle being so situated that the nozzle is in the vicinity of the processing nozzle when the arm is in the waiting position.

According to the substrate processing system of the present invention, droplets of the processing liquid sticking to the processing nozzle can be removed by blowing a gas to the processing nozzle from the gas-blowing nozzle. Therefore, even if a two-fluid nozzle, to which droplets of a processing liquid tend to stick, for example, is used as the processing nozzle, it is possible to prevent occurrence of water marks on a substrate whose cause is dripping of a processing liquid.

The substrate processing system according to the present invention can further comprise a receiver that catches droplets falling from the processing nozzle, the receiver being so situated that the receiver is below the processing nozzle when the arm is in the waiting position. According to such a substrate processing system, droplets of the processing liquid can be collected in the receiver. In this case, the substrate processing system can further have an exhaust passage communicating with the receiver, through which the droplets collected in the receiver are exhausted from the receiver.

In the substrate processing system according to the present invention, the gas-blowing nozzle may be situated below the processing nozzle.

Further, in the substrate processing system according to the present invention, the gas-blowing nozzle may be situated on each side of a path along which the processing nozzle moves as the arm approaches the waiting position.

Furthermore, in the substrate processing system according to the present invention, the gas-blowing nozzle can have a blow-off opening extending along a path along which the processing nozzle moves as the arm approaches the waiting position.

Furthermore, the substrate processing system according to the present invention can further comprise an enclosure by which a space below the processing nozzle supported by the arm that is in the waiting position is surrounded on two sides that correspond to both sides of a path along which the processing nozzle moves as the arm approaches the waiting position. Alternatively, the substrate processing system according to the present invention can further comprise an enclosure by which a space below the processing nozzle supported by the arm that is in the waiting position is surrounded on three sides that correspond to both sides of a path along which the processing nozzle moves as the arm approaches the waiting position and to the front side of the path. According to such a substrate processing system, the droplets of the processing liquid removed from the processing nozzle can be collected in an area enclosed in the enclosure. It is therefore possible to prevent effectively the droplets removed from the processing nozzle from being scattered on the substrate. Furthermore, in these cases, the gas-blowing nozzle can have a blow-off opening in a side of the enclosure facing the space below the processing nozzle.

Furthermore, the substrate processing system according to the present invention can further comprise a nozzle capable of discharging water to the processing nozzle, the water-discharging nozzle being so situated that the water-discharging nozzle is in the vicinity of the processing nozzle when the arm is in the waiting position.

A method of substrate processing according to the present invention comprises the steps of positioning a processing nozzle above a substrate to be processed and supplying a processing liquid to the substrate from the processing nozzle, stopping the supply of the processing liquid from the processing nozzle, moving the processing nozzle to the outside of the substrate, and blowing a gas to the processing nozzle situated on the outside of the substrate so as to remove droplets sticking to the processing nozzle.

According to the method of substrate processing of the present invention, the droplets sticking to the processing nozzle are removed by blowing a gas to the processing nozzle. Therefore, even when a two-fluid nozzle, to which droplets of a processing liquid tend to stick, for example, is used as the processing nozzle, it is possible to prevent occurrence of water marks on a substrate whose cause is dripping of a processing liquid. The step of stopping the supply of the processing liquid from the processing nozzle and the step of moving the processing nozzle to the outside of the substrate may be performed in any order, even in parallel with each other.

In the step of removing droplets from the processing nozzle in the method of substrate processing according to the present invention, a receiver may be placed below a processing nozzle to catch the droplets removed from the processing nozzle. According to such a method of substrate processing, the droplets of the processing liquid can be collected in the receiver. In this case, the droplets collected in the receiver may be exhausted to the outside of the substrate processing system through an exhaust passage communicating with the receiver.

Further, in the step of removing droplets from the processing nozzle in the method of substrate processing according to the present invention, the gas may be blown to the processing nozzle from below.

Furthermore, in the step of removing droplets from the processing nozzle in the method of substrate processing according to the present invention, the gas may be blown to the processing nozzle from both sides of a path along which the processing nozzle moves to the outside of the substrate.

Furthermore, in the step of removing droplets from the processing nozzle in the method of substrate processing according to the present invention, the gas may be blown to the processing nozzle from a blow-off opening extending along a path along which the processing nozzle moves to the outside of the substrate.

Furthermore, in the step of removing droplets from the processing nozzle in the method of substrate processing according to the present invention, the droplets removed from the processing nozzle may be guided by an enclosure with which a space below the processing nozzle situated on the outside of the substrate is surrounded on two sides that correspond to both sides of a path along which the processing nozzle moves to the outside of the substrate. Alternatively, in the step of removing droplets from the processing nozzle in the method of substrate processing according to the present invention, the droplets removed from the processing nozzle may be guided by an enclosure by which a space below the processing nozzle situated on the outside of the substrate is surrounded on three sides that correspond to both sides of a path along which the processing nozzle moves to the outside of the substrate and to the front side of the path. According to such a method of substrate processing, the droplets removed from the processing nozzle can be collected in an area enclosed in the enclosure. It is therefore possible to prevent effectively the droplets removed from the processing nozzle from being scattered on the substrate. In these cases, in the step of removing droplets from the processing nozzle, the gas may be blown from a blow-off opening in a side of the enclosure facing the space below the processing nozzle situated on the outside of the substrate.

Furthermore, the method of substrate processing according to the present invention can further comprise the step of discharging water to the processing nozzle situated on the outside of the substrate so as to remove droplets sticking to the processing nozzle, wherein the step of discharging water to the processing nozzle may be performed prior to the step of blowing a gas to the processing nozzle.

Furthermore, the method of substrate processing according to the present invention can further comprise the step of drying the substrate to which the processing liquid has been supplied, wherein the step of drying the substrate may be performed in parallel with the step of removing droplets from the processing nozzle. With such a method of substrate processing, a substrate can be processed efficiently.

A program according to the present invention is to be carried out by a control device for controlling a substrate processing system, and when run by the control device so as to accomplish a method of substrate processing comprising the steps of positioning a processing nozzle above a substrate to be processed and supplying a processing liquid to the substrate from the processing nozzle, stopping the supply of the processing liquid from the processing nozzle, moving the processing nozzle to the outside of the substrate, and blowing a gas to the processing nozzle situated on the outside of the substrate so as to remove droplets of the processing liquid sticking to the processing nozzle.

In the program according to the present invention, in the step of supplying the processing liquid in the method of substrate processing, the processing liquid may be mixed with a gas in the processing nozzle that is a two-fluid nozzle and may be discharged from the processing nozzle along with the gas.

A storage medium according to the present invention stores a program to be carried out by a control device for controlling a substrate processing system so as to accomplish a method of substrate processing comprising the steps of positioning a processing nozzle above a substrate to be processed and supplying a processing liquid to the substrate from the processing nozzle, stopping the supply of the processing liquid from the processing nozzle, moving the processing nozzle to the outside of the substrate, and blowing a gas to the processing nozzle situated on the outside of the substrate so as to remove droplets of the processing liquid sticking to the processing nozzle.

In the storage medium according to the present invention, in the step of supplying the processing liquid in the method of substrate processing, the processing liquid may be mixed with a gas in the processing nozzle that is a two-fluid nozzle and may be discharged from the processing nozzle along with the gas.

DETAILED DESCRIPTION OF THE INVENTION

With reference to the accompanying drawings, an embodiment of the present invention will be described hereinafter.

In the following embodiment, a substrate processing system of the present invention is used as a wafer cleaning unit for cleaning semiconductor wafers (an example of substrates to be processed) whose outlines are approximately discal, and is incorporated in a wafer processing system. However, the substrate processing system of the invention, of course, has many applications other than wafer cleaning units.

Figure 8:
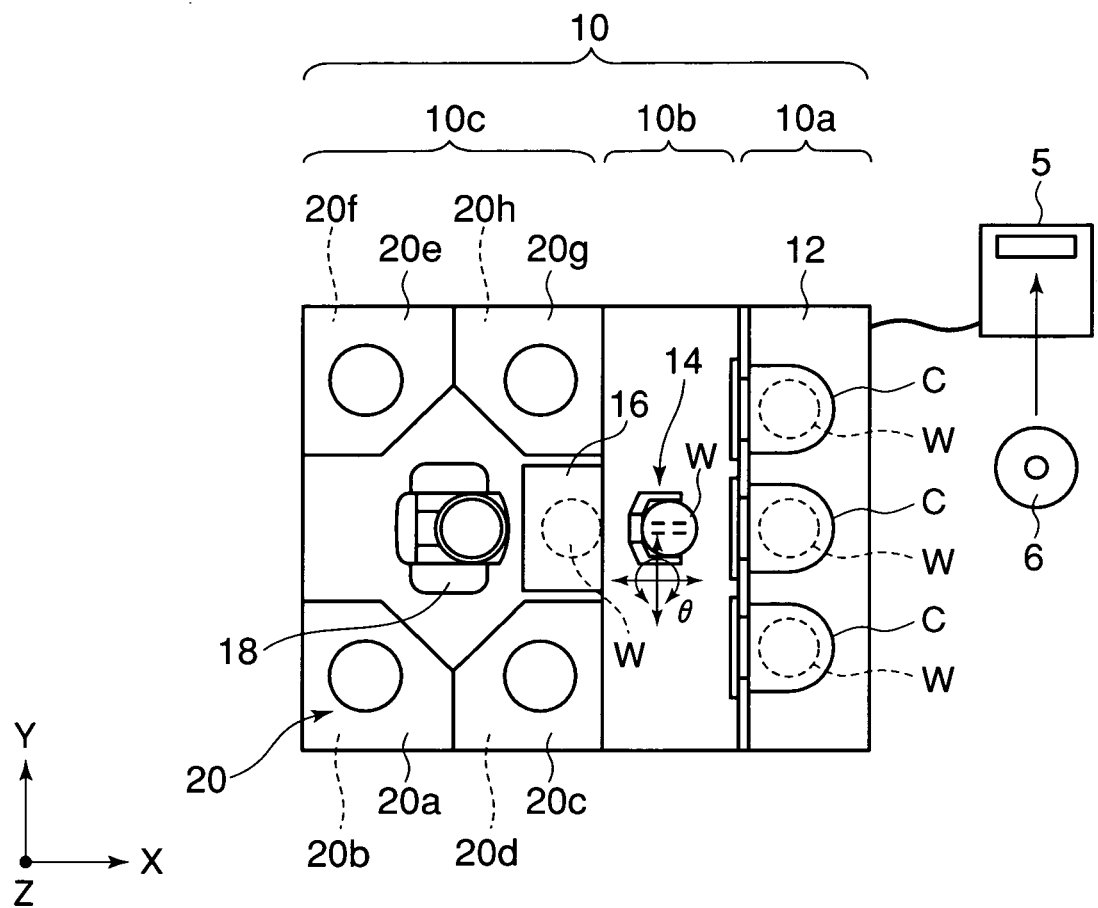
FIG. 8 illustrates a wafer processing system in which the substrate processing system is incorporated.

A wafer processing system in which a substrate processing system of this embodiment can be incorporated will be first described with reference to FIG. 8. FIG. 8 illustrates one example of a wafer processing system in which the substrate processing system is incorporated.

As FIG. 8 shows, a wafer processing system 10 comprises a table section 10a in which a wafer W before or after being subjected to processing is placed on a table, a cleaning section 10c in which a wafer W is cleaned, and a transfer section 10b in which a wafer W is transferred from the table section 10a to the cleaning section 10c, or from the cleaning section 10c to the table section 10a.

The wafer processing system 10 has a table 12 in the table section 10a. To the table 12, carrier boxes C, each carrier box containing wafers W to be processed, can be detachably attached. In this embodiment, each carrier box C holds a plurality of wafers W, e.g., twenty-five wafers W, that are arranged nearly horizontally at fixed spaces with the surfaces (the surfaces to be processed, on which semiconductor devices will be formed) facing upward.

A wafer transferring unit 14 for transferring a wafer W is situated in the transfer section 10b. The wafer transferring unit 14 is movable in the X direction and the Y direction and can gain access to the carrier boxes C as well as to a wafer delivering unit 16 through which wafers W are delivered in and from the cleaning section 10c.

The cleaning section 10c includes the above-described wafer delivering unit 16, a substrate processing system 20 of this embodiment, and a main wafer transferring unit 18 for transferring a wafer W from the wafer delivering unit 16 to the substrate processing system 20, or from the substrate processing unit 16. In this embodiment, eight substrate processing systems (wafer cleaning units) 20a-20h are arranged in the cleaning section 10c so that four substrate processing systems of them are situated in four different positions within the X-Y plane and that the other four substrate processing systems are under the above four substrate processing systems. Further, in this embodiment, the main wafer transferring unit 18 is movable in the X direction and the Y direction, rotatable in the X-Y plane (in the θ direction), and also movable in the Z direction. The main wafer transferring unit 18 can therefore gain access to the respective substrate processing units 20a-20h and to the wafer delivering unit 16.

The above various units are connected to a control device 5 including a computer (see FIG. 8). For example, they operate on control signals sent from the control device 5 that is under the control of a program stored on a storage medium 6.

In such a wafer cleaning system 10, a wafer W contained in the carrier box C is first transferred to the wafer delivering unit 16 by the wafer transferring unit 14. The wafer W in the wafer delivering unit 16 is then transferred to a non-operating substrate processing system 20 by the main wafer transferring unit 18 and is cleaned in this substrate processing system 20. The wafer W that has been cleaned is returned to the carrier box C via the wafer delivering unit 16 by the main wafer transferring unit 18 and the wafer transferring unit 14.

A series of processes that are performed on one wafer W in the wafer processing system 10 are thus completed.

Figure 4:
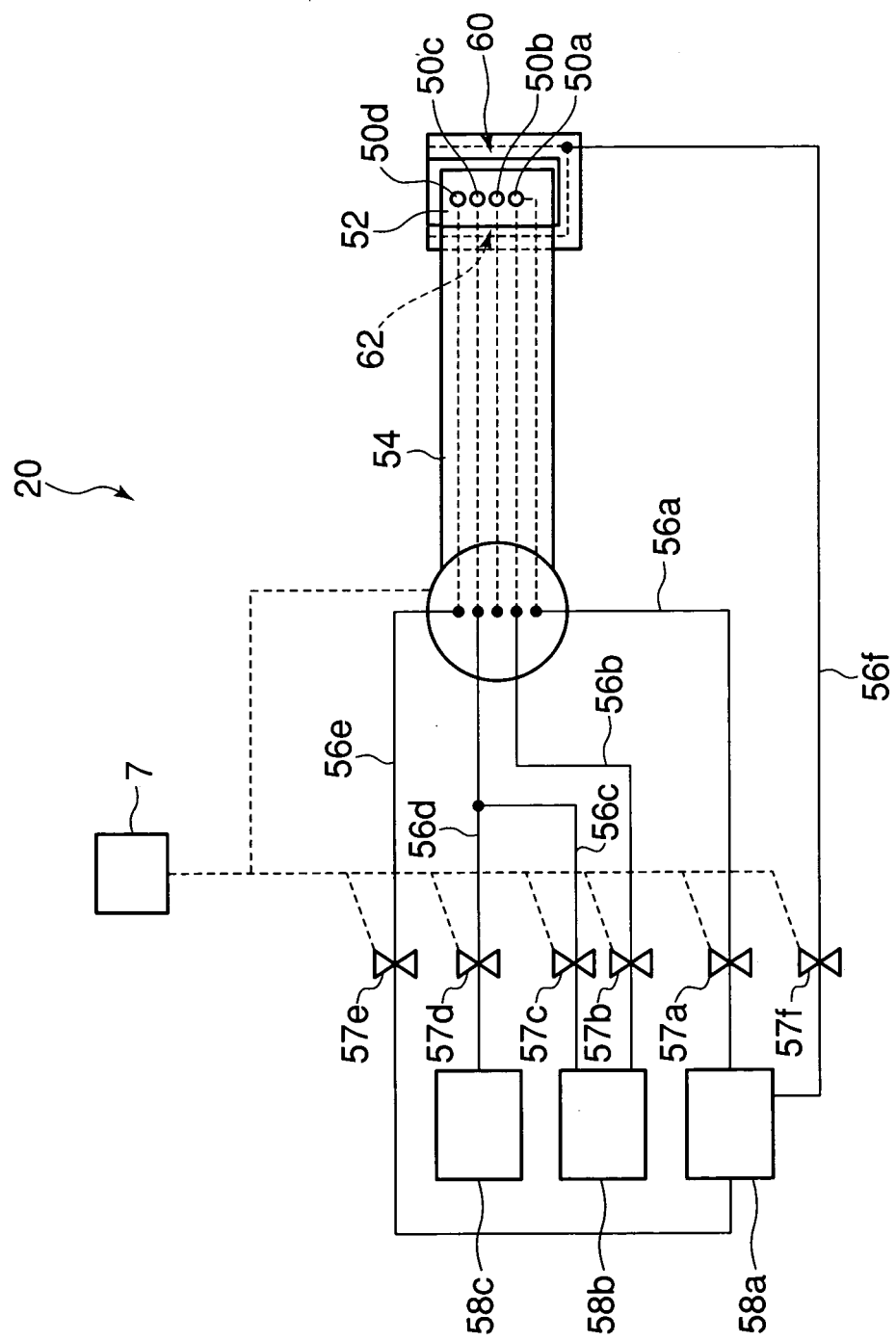
FIG. 4 is a view showing a pipeline in the substrate processing system.
Figure 5:
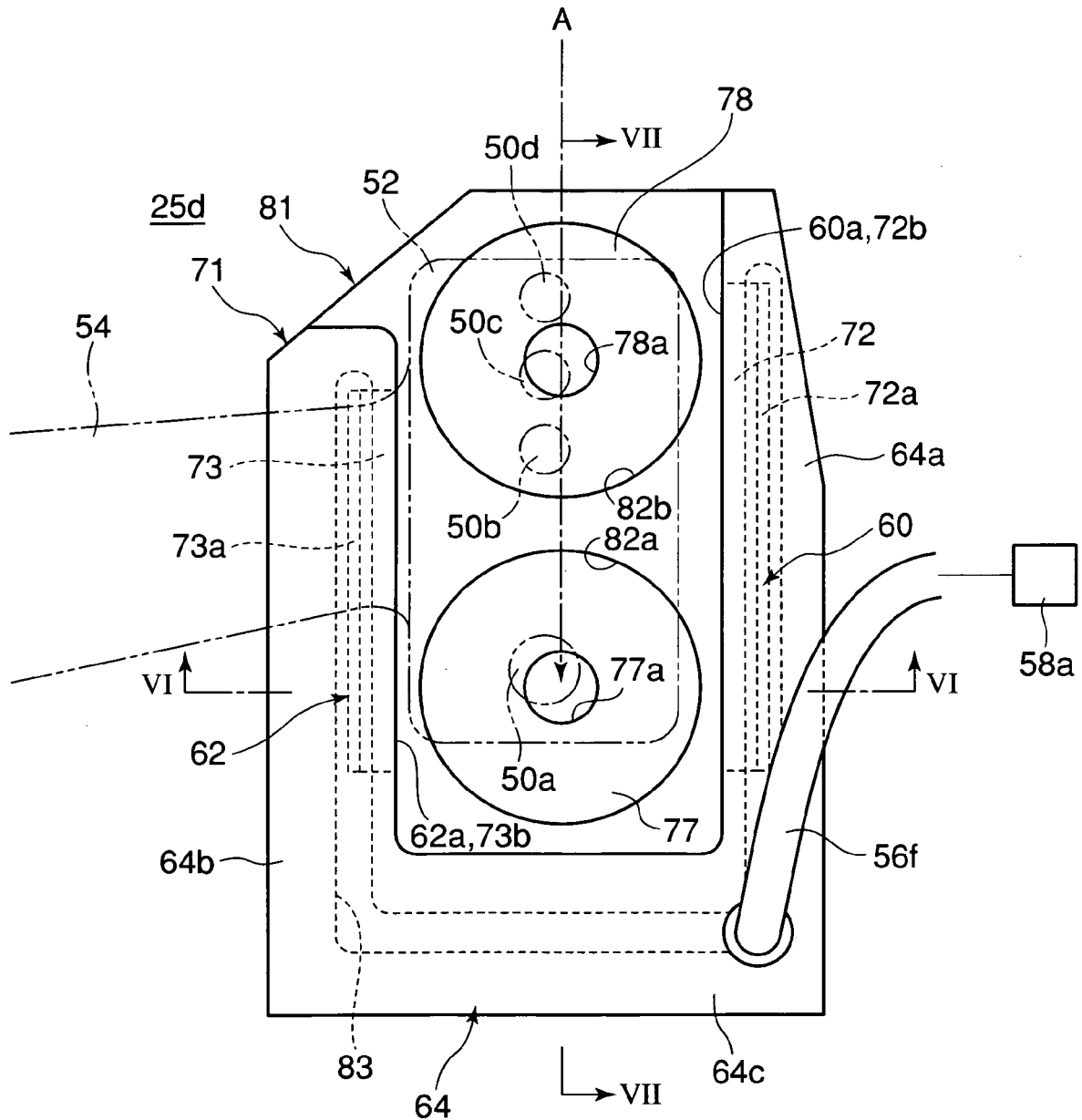
FIG. 5 is a top plane view showing droplet removing nozzles in the substrate processing system.
Figure 6:
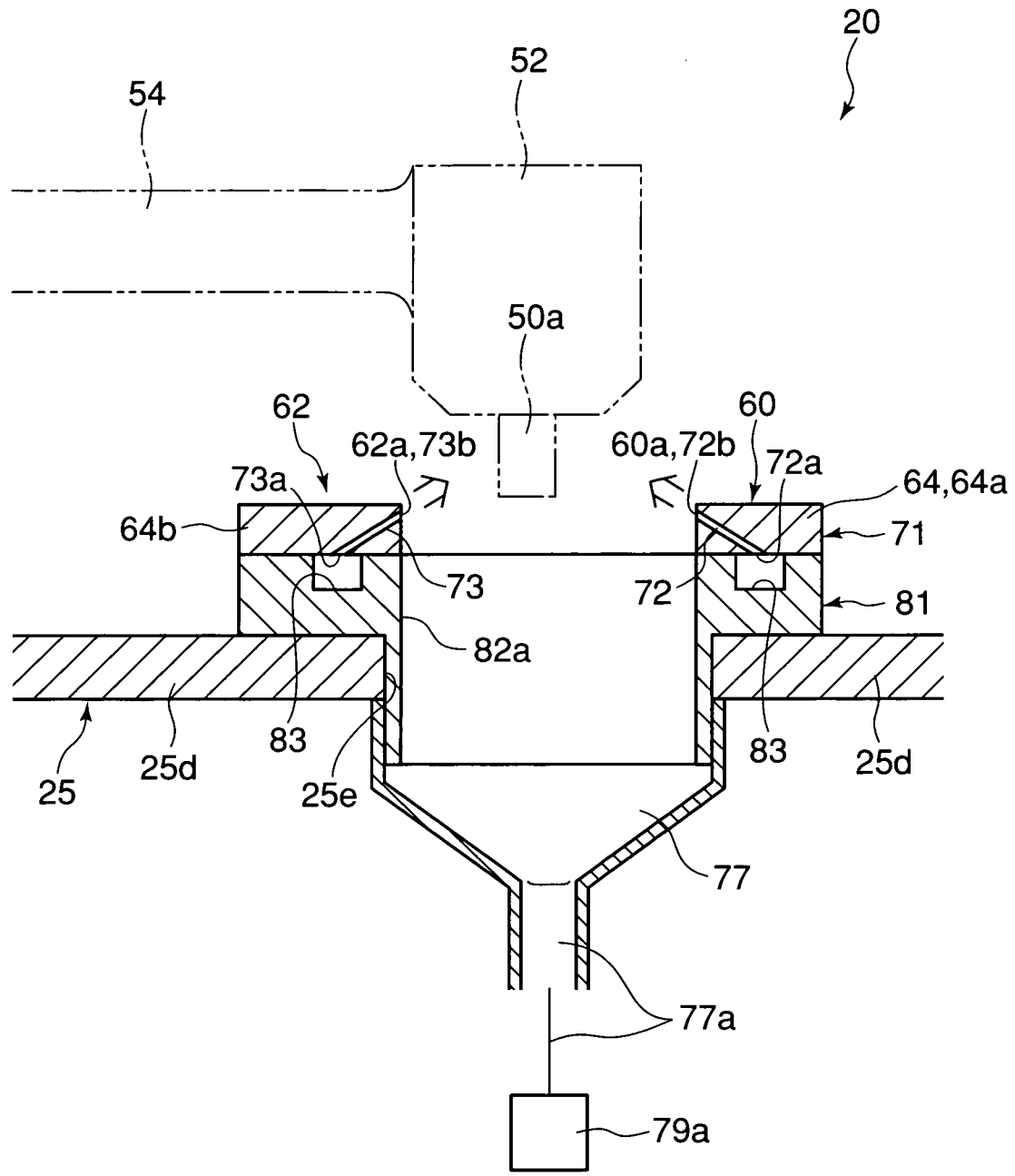
FIG. 6 is a sectional view taken along line VI-VI in FIG. 5.
Figure 7:
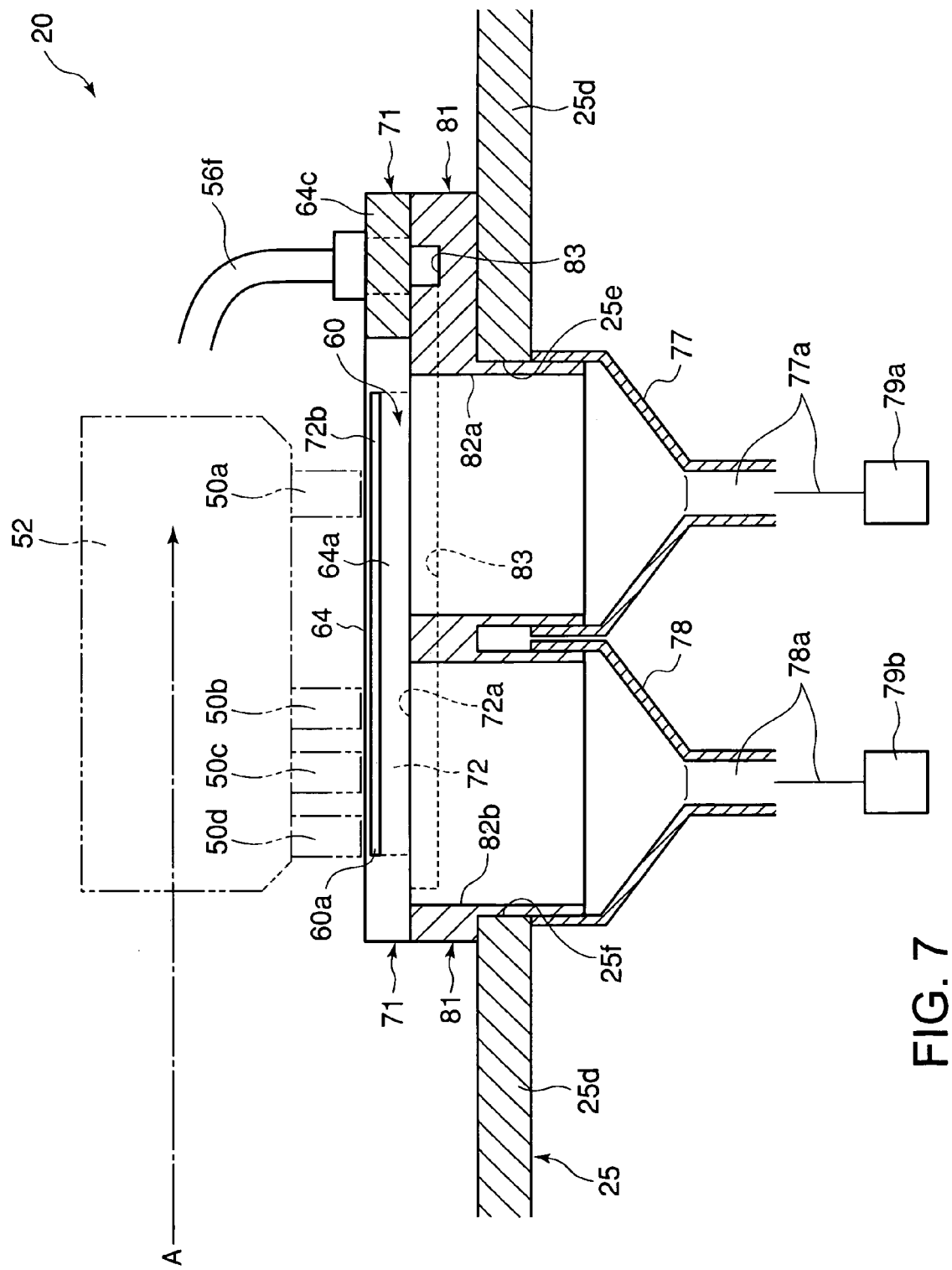
FIG. 7 is a sectional view taken along line VII-VII in FIG. 6.

Next, an embodiment of the substrate processing system (wafer cleaning unit) 20 according to the present invention will be described in detail with reference mainly to FIGS. 1 to 7. Of these figures, FIG. 1 is a sectional view of the substrate processing system, FIG. 2 is a sectional view of the substrate processing system, taken along line II-II in FIG. 1, FIG. 3 is a view similar to that of FIG. 2 and illustrates the substrate processing system in a variant state, FIG. 4 is a view showing a pipeline in the substrate processing system, FIG. 5 is an enlarged partial view of FIG. 1 and is a top plane view of droplet removing nozzles in the substrate processing system, FIG. 6 is a sectional view taken along line VI-VI in FIG. 5, and FIG. 7 is a sectional view taken along line VII-VII in FIG. 6.

Eight substrate processing units 20 are situated in the wafer processing system 10, as mentioned above. Each substrate processing system 20 has an airtight bulkhead (unit chamber) 22 by which one substrate processing unit is isolated from the rest of the substrate processing systems, as shown in FIG. 1. The bulkhead 22 has an opening 23a and a mechanical shutter 23b. The mechanical shutter 23b can open the opening 23a and close the opening 23a. The structures of the substrate processing systems 20 are nearly the same, except that they are symmetrical. The bulkhead 22 is omitted from FIGS. 2 and 3.

Figure 1:
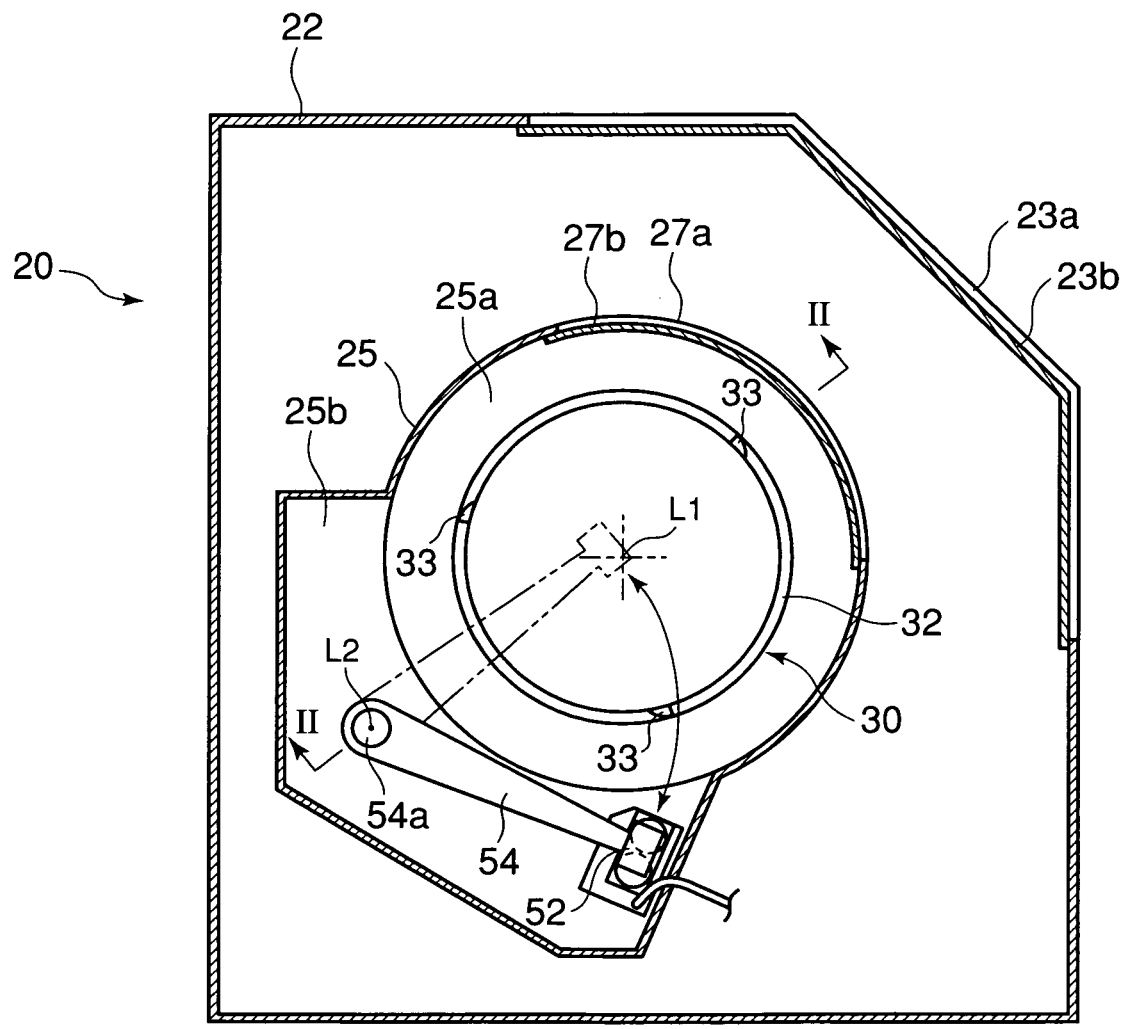
FIG. 1 is a sectional view showing an embodiment of a substrate processing system according to the present invention.
Figure 2:
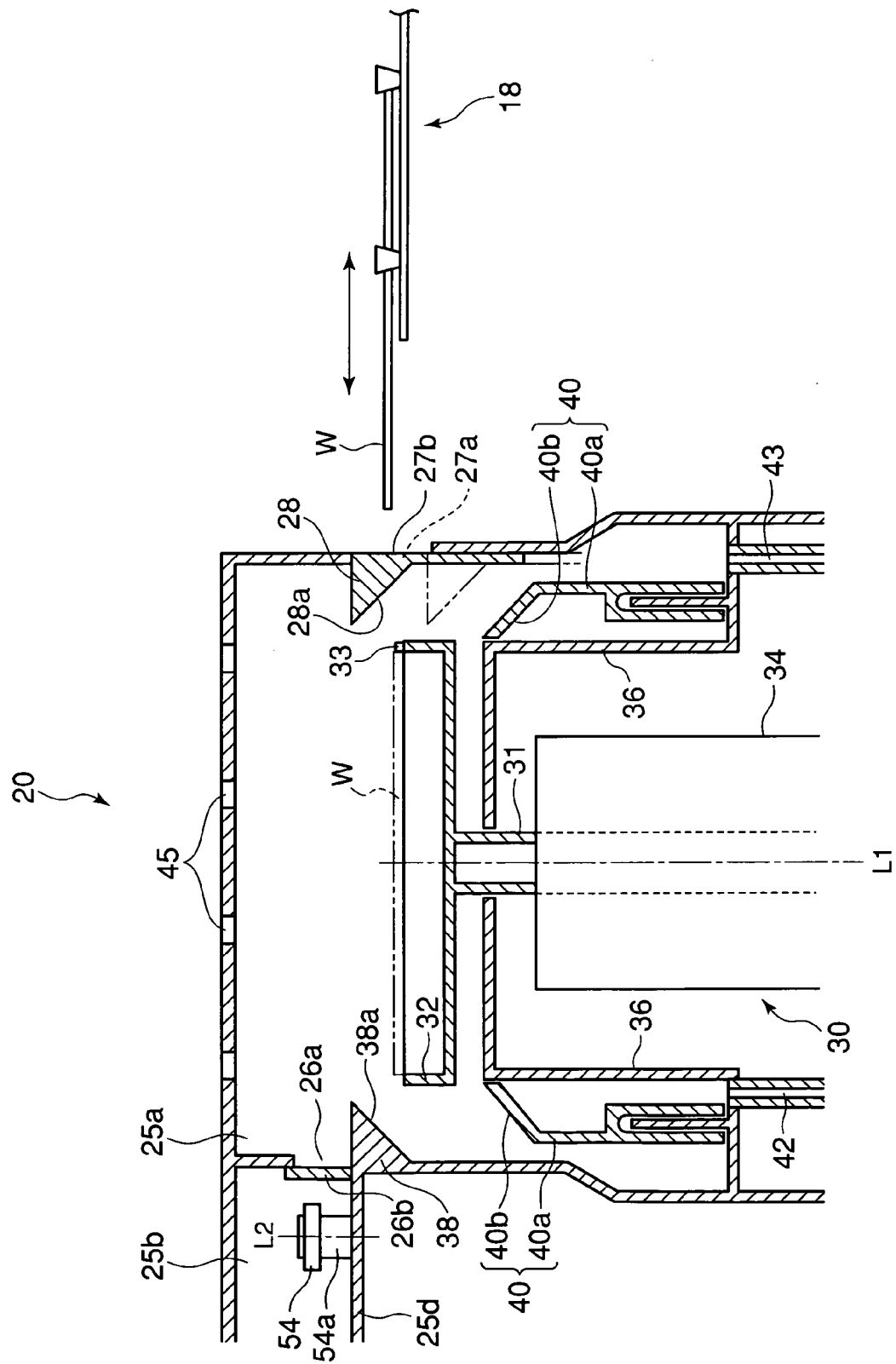
FIG. 2 is a sectional view of the substrate processing system, taken along line II-II in FIG. 1.
Figure 3:
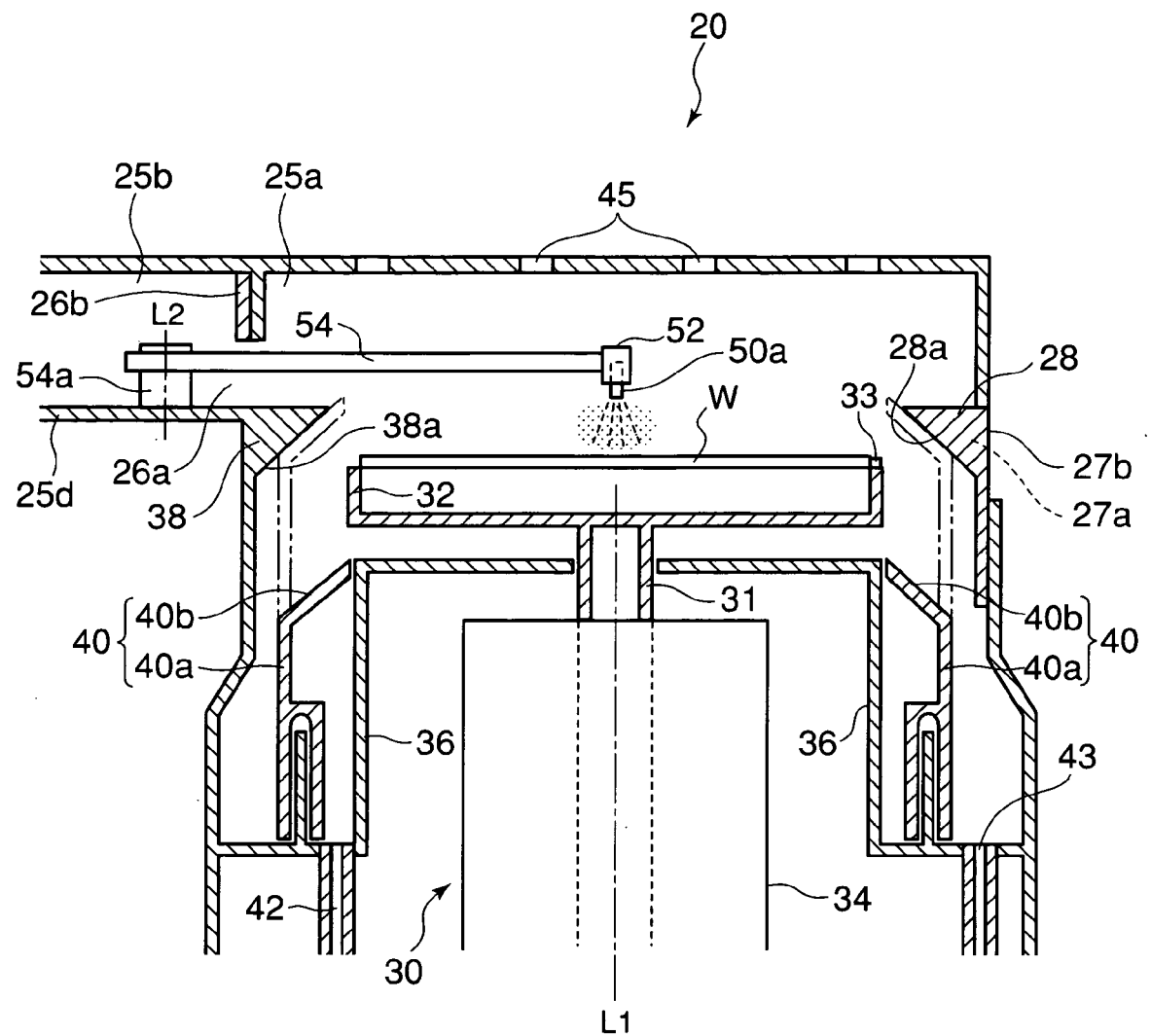
FIG. 3 is a view similar to that of FIG. 2 and illustrates the substrate processing system in a variant state.

As shown in FIGS. 1 to 3, the substrate processing system 20 has an airtight processing container 25 in which a wafer W to be processed is placed, and the processing container 25 is divided into two: a processing chamber 25a in which a wafer W is placed, and an arm container 25b adjacent to the processing chamber 25. Between the processing chamber 25a and the arm container 25b, an opening 26a through which the processing chamber 25a communicates with the arm container 25b, and a shutter 26b that can open the opening 26a and close the opening 26a are disposed, as shown in FIGS. 2 and 3. Further, as shown in FIGS. 1 to 3, the processing chamber 25 has an opening 27a through which the processing chamber 25a communicates with the outside, and a mechanical shutter 27b that can open the opening 27a and close the opening 27a. The opening 27a in the processing chamber 25 is in such a position that the opening 27a faces the opening 23a in the bulkhead 22.

First, the inner structure of the processing chamber 25a will be described in detail.

The substrate processing system 20 has, in the processing chamber 25a, a rotary holder 30 capable of nearly horizontally holding a wafer W and rotating the wafer W, as shown in FIGS. 2 and 3. As shown in FIGS. 2 and 3, the rotary holder 30 situated in the processing chamber 25a includes; a rotating cylinder 31; a chuck body 32 set on the top of the rotating cylinder 31; holding members (retainers) 33 supported by the chuck body 32; and a hollow motor 34 supporting the rotating cylinder 31. The hollow motor 34 drives the rotary cylinder 31 such that the rotary cylinder 31 rotates. Three holding members 33 are arranged at nearly equal spaces to each other on the top of the chuck body 32, on the circumference of the rotary cylinder 31 whose center is the axis of rotation L1, as shown in FIG. 1. A wafer W can be retained (held) at outer edge by these holding members 33.

The processing chamber 25 has, on its inner surface, a projection 38 in such a position that it is horizontally apart from a wafer W (indicated by a two-dot chain line in FIG. 2) held on the rotary holder 30, as shown in FIGS. 2 and 3. The cross section of this projection 38 is approximately triangular. The projection 38 has a slant 38a extending from the upper part of the side of the processing chamber 25, inclining towards a wafer W held on the rotary holder 30. Similarly, the mechanical shutter 27b of the processing chamber 25 has a shutter projection 28 with a slant 28a, whose cross section is nearly the same as that of the projection 38. As shown in FIGS. 2 and 3, when the opening 27a is closed with the mechanical shutter 27b (i.e., when the mechanical shutter 27b is elevated), the projection 38 and the shutter projection 28 are at nearly the same level, and the slant 38a of the projection 38 and the slant 28a of the shutter projection 28 form an almost-continuous, circuital slant along the inner surface of the processing chamber 25.

Further, a cylindrical inner cup 40 is situated outside the rotary holder 30 in the processing chamber 25, as shown in FIGS. 2 and 3. The inner cup 40 is composed of a cylindrical part 40a whose shape is approximately cylindrical and a slant 40b extending from the upper end of the cylindrical part 40a, inclining inwardly. This inner cup 40 is linked to an inner-cup-driving mechanism not shown in the figure and can be moved up and down by the inner-cup-driving mechanism.

Such component elements as the projection 38, the shutter projection 28, and the inner cup 40 are omitted from FIG. 1 in order to facilitate the understanding of the entire structure of the substrate processing system 20.

The processing container 25 has, in its bottom, a first exhaust port 42 on the inside of the inner cup 40 and a second exhaust port 43 on the outside of the inner cup 40, as shown in FIGS. 2 and 3.

On the other hand, the processing container 25 has, in its top surface, a plurality of air holes 45. Through these air holes 45, a gas is supplied to the processing chamber 25a in the processing container 25. The gas supplied to the processing chamber 25a flows downward and is exhausted to the outside through the first exhaust port 42 or the second exhaust port 43. A gas flowing into the processing chamber 25a through the air holes 45A thus forms a down flow in the processing chamber 25a. Air that has been passed through a filter, or such an inert gas as nitrogen, can be selected as the gas to be supplied to the processing chamber 25a, and preferably, dried nitrogen can be selected.

As FIGS. 2 and 3 show, the hollow motor 34 constructing a part of the rotary holder 30 is situated in the inner cup 40. Inside the inner cup 40, an inner partition 36 is disposed, and the inner partition 36 surrounds the hollow motor 34. The inner partition 36 is in an approximately cylindrical shape with a closed end and serves to prevent dusts or the like from the hollow motor 34 from being scattered in the processing chamber 25a.

Next, the inner structure of the arm container 25 will be described in detail.

The substrate processing unit 20 has a plurality of processing nozzles 50a, 50b, 50c, 50d through which a liquid or gas is discharged to a wafer W so as to clean the wafer W, a nozzle head 52 to which the processing nozzles 50a-50d are fixed, and a movable arm 54 supporting the nozzle head 52, as shown FIG. 4. The arm 54 is movable between a processing position (the position indicated by a two-dot chain line in FIG. 1) and a waiting position (the position indicated by a solid line in FIG. 2). The processing nozzles 50a-50d are situated above a wafer W when the arm in in the processing position and are situated horizontally apart from a wafer W (horizontally outside the wafer W) when the arm is in the waiting position. When the arm 54 is in the processing position, the processing nozzles 50a-50d supported by the arm 54 are situated above a wafer W held on the rotary holder 30, in approximately the center of the wafer W surface, as shown in FIG. 1.

The substrate processing unit 20 further comprises droplet removing nozzles 60, 62 for blowing a gas to the processing nozzles 50a-50d, which are so placed that they are in the vicinity of the processing nozzle 50a when the arm 54 is in the processing position, as shown in FIGS. 4-7.

In this embodiment, the arm 54 is so linked, at its non-nozzle head 52-side end, to a shaft 54a that it can pivot on the shaft 54a, as shown in FIG. 1. The arm 54 is driven by an arm-driving mechanism not shown in the figure and pivots on the pivot point L2, the center of the shaft 54a. If the arm 54 pivots when the opening 26a is open, the nozzle head 52-side end of the arm 54 enters into the processing chamber 52a from the arm container 25b through the opening 26, as shown in FIG. 3.

The first to fourth processing nozzles 50a-50d are fixed to the end of the arm 54, as mentioned above. Of these processing nozzles, the first processing nozzle 50a is formed of a two-fluid nozzle capable of mixing a gas with a liquid and capable of jetting fine droplets of the liquid with the gas. On the other hand, the other processing nozzles are formed of single-fluid nozzles through which a gas or liquid is discharged singly.

As FIG. 4 shows, the first processing nozzle 50a is connected to the source of gas (nitrogen) 58a by a first pipe 56a and the first processing nozzle 50a is also connected to the source of deionized water (DIW) 58b by a second pipe 56b. The third processing nozzle 50c is connected to the source of deionized water (pure water) 58b by a third pipe 56c and the third processing nozzle 50c is also connected to the source of a chemical liquid 58c by a fourth pipe 56d. The fourth processing nozzle 50d is connected to the source of gas 58a by a fifth pipe 56e. In this embodiment, the second processing nozzle 50b is not connected to any source of gas or liquid, as shown in FIG. 4, but the second processing nozzle 50b can be connected to the source of gas 58a, to the source of deionized water 58b, or to the source of a chemical liquid 58c, if necessary.

Further, the first to fifth pipes 56a, 56b, 56c, 56d, 56e have first to fifth valves 57a, 57b, 57c, 57d, 57e, respectively, as shown in FIG. 4. The first to fifth pipes 56a to 56e can be opened or closed by opening or closing the first to fifth valves 57a to 57e, respectively.

The arm-driving mechanism not shown in the figure and the first to fifth valves 57a-57e are connected to a pipeline control device 7, as shown in FIG. 4, and are controlled by the pipeline control device 7. The pipeline control device 7 is a component of the above-described control device 5.

The gas to be supplied from the source of gas 58a may be one other than nitrogen. There is no particular limitation also on the chemical liquid to be supplied from the source 56c. The gas and the chemical liquid to be supplied may be freely designed, taking account of the details of processing to be conducted by the substrate processing system 20, the required degree of processing, and so forth. Similarly, the composition of the pipeline, including the number of the processing nozzles 50a-50d, may be freely designed with consideration for the details of processing to be conducted by the substrate processing system 20, the required degree (required quality) of processing, and the like. Furthermore, in the pipeline in this embodiment, the source of gas 58a and the source of deionized water 58b are connected to different processing nozzles. However, a plurality of the sources of gas or a plurality of the sources of deionized water 58b, corresponding to each of the processing nozzles may be provided. In the case where the source of gas and source of deionized water are connected to one processing nozzle, the processing nozzles may be made to discharge different gases or liquids.

The droplet removing nozzles (gas-blowing nozzles) 60, 62 will be described in detail with reference mainly to FIGS. 5 to 7.

In this embodiment, the substrate processing system 20 has a first droplet removing nozzle 60 situated on one side of a path A (on the right-hand side of the path A in FIG. 5) along which the processing nozzles (typically the first processing nozzle 50a) move as the arm 54 approaches the waiting position, and a second droplet removing nozzle 62 situated on the other side of the path A (on the left-hand side of the path A in FIG. 5) along which the processing nozzles (typically the first processing nozzle 50a) move.

As shown in FIGS. 5 to 7, the first droplet removing nozzle 60 and the second droplet removing nozzle 62 are made with a first block material 71 that is almost U-shaped as shown in a plane view (FIG. 5) and a second block material 81 that is approximately rectangular as shown in a plane view (FIG. 5) and has two through holes 82a, 82b. The first block material 71 and the second block material 81 have nearly the same outline, as shown in FIG. 5. The first block material 71 is laid over and fixed to the second block material 81 so that the outline of the first block material 71 approximately coincides with the outline of the second block material 81.

In the arm container 25b, the second block material 81 is mounted on the bottom 25d of the processing container 25 (see FIGS. 2 and 3). As shown in FIG. 7, there are two through holes 25e, 25f also in the bottom 25d of the processing container 25. The second block material 81 is so mounted on the bottom 25d of the processing container 25 that the two through holes 82a, 82b formed in the second block material 81 coincide with the two through holes 25e, 25f formed in the bottom 25d of the processing container 25, respectively, as shown in FIG. 7.

The first block material 71 and the second block material 81 are positioned on the bottom 25d of the processing container 25 so that the space below the first to fourth processing nozzles 50a-50d supported by the arm 54 that is in the waiting position is surrounded by the first block material 71 on three sides that correspond to both sides of the path A along which the processing nozzles move as the arm 54 comes into the waiting position and to the front side (forward) of the path A, as shown in FIG. 5.

A groove 83 that has approximately U-shaped as shown in a plane view (FIG. 5) is cut in the surface of the second block material 81. This groove 83 is cut in such a position that it is hidden beneath the first block material 71 laid over the second block material 81 (FIG. 5). On the other hand, the first block material 71 has, on one side of the path A along which the processing nozzles move, a slot 72 extending along the path A. Similarly, the first block material 71 has, on the other side of the path A along which the processing nozzles move, a slot 73 extending along the path A. The expression "along the path A" herein encompasses not only the state of being "in exactly parallel with the path A" but also the state of being "in approximately parallel with the path A". In this embodiment, the path A along which the processing nozzles move is arc, to be exact, because the arm 54 moves in an arc, while the slots 72, 73 are linear.

Openings 72a, 73a, on one side, of the slots 72, 73 face the groove 83 in the second block material 81, as shown in FIG. 6. The slots 72, 73 linearly extend from the openings 72a, 73a towards openings 72b, 73b on the other side, respectively, and the processing nozzles 50a-50d are on the extensions along the longitudinal direction of the slot when the arm 54 is in the waiting position, as shown in FIG. 6.

Further, the groove 83 in the second block material 81 is connected to the source of gas 58a by a sixth pipe 56f, as shown in FIGS. 4 and 7. The sixth pipe 56f has a sixth valve 57 connected to the pipeline control device 7 like the first to fifth pipes 56a-56e. The sixth valve 57f can be controlled by the pipeline control device 7 so that the sixth valve 57f can open the sixth pipe 56f and can close the sixth pipe 56f. Namely, a compressed gas can be delivered to the groove 83 in the second block material 81, and a gas delivered to the groove 83 is blown on the processing nozzles 50a-50d from the first and second slots 72, 73 in the first block material 71. The sixth pipe 56f may be connected to an independent source of gas different from the source 58a. Moreover, a gas other than nitrogen may be delivered to the groove 83 through the sixth pipe 56f.

The first and second droplet removing nozzles 60, 62 situated below the processing nozzles 50a-50d are thus made with the first block material 71 and the second block material 81. The opening 72b of the first slot 72 in the first block material 71 forms the blow-off opening 60a of the first droplet removing nozzle 60, and the opening 73b of the second slot 73 in the first block material 71 forms the blow-off opening 62a of the second droplet removing nozzle 62, as shown in FIGS. 5 and 7. Therefore, the blow-off openings 60a, 62a of the droplet removing nozzles 60, 62 extend along the path A along which the processing nozzles move.

On the other hand, first and second receivers 77, 78 are situated under the two through holes 82a, 82b in the second block material 81, respectively, as shown in FIGS. 5 to 7. As will be described later, a liquid sticking to the processing nozzles 50a-50d and to the nozzle head 52 is removed from the nozzles 50a-50d and the nozzle head 52 by a gas jetted from the first droplet removing nozzles 61 and the second droplet removing nozzles 62. The first receiver 77 is placed below the first processing nozzle 50a, as shown in FIGS. 5 and 7, and the droplets removed from the first processing nozzle 50a are collected mainly in this receiver. The second receiver 78 is placed below the second, third and fourth processing nozzles 50b, 50c, 50d, and the droplets removed from these processing nozzles 50b, 50c, 50d are collected mainly in this receiver.

The first receiver 77 is connected to a first droplet exhaust passage 77a, as shown in FIGS. 6 and 7. The droplets, which have been caught in the first receiver 77, are discharged through the first droplet exhaust passage 77a and are collected in a first collection container 79a. Similarly, the second receiver 78 is connected to a second droplet exhaust passage 78a. The droplets, which have been caught in the second receiver 78, are discharged through the second droplet exhaust passage 78a and are collected in a second collection container 79b.

In the meantime, the first block material 71 is in the shape of the letter U as shown in a plane view, as mentioned above. Further, in this embodiment, the first block material 71 is so situated that upper surface of the first block material 71 is in the vicinity of the lower ends of the first to fourth processing nozzles 50a-50d, as shown in FIGS. 6 and 7. That is to say, the space below the first to fourth processing nozzles 50a-50d supported by the arm 54 that is in the waiting position is surrounded by the first block material 71 on three sides that correspond to both sides of the path A along which the processing nozzles move and to the front side of the path A. Therefore, the first block material 71 functions as an enclosure 64 having: a side part 64a on one side by which the space below the first to fourth processing nozzles 50a-50d supported by the arm 54 that is in the waiting position is surrounded on a side that correspond to one side of the path A along which the processing nozzles move; a side part 64b on the other side by which the space is surrounded on a side that correspond to the other side of the path A; and a front part 64c by which the space is surrounded on a side that correspond to the front side of the path A, so that the first block material 71 guides the processing liquid removed from the first to fourth processing nozzles 50a-50d and from the nozzle head 52 to the receivers 77, 78. As shown in FIGS. 6 and 7, in this embodiment, the first droplet removing nozzle 60 has the blow-off opening 60a on a side surface, facing the space below the processing nozzles 50a-50d, of the side part 64a. Similarly, the second droplet removing nozzle 62 has the blow-off opening 62a on a side surface, facing the space below the processing nozzles 50a-50d, of the side part 64b.

Next, the process of cleaning wafers W using the substrate processing system 20 having the above-described structure will be described below.

First, the bulkhead mechanical shutter 23b and the mechanical shutter 27b open, and a wafer W held by the above-described main wafer transferring unit 18 is carried into the processing chamber 25a. In this step, the wafer W is held approximately horizontal with the surface facing up, as shown in FIG. 2. The wafer W carried in the processing chamber 25a is placed on the chuck body 32 mounted on the rotary holder 30 and is retained at edge by the holding members 33. The bulkhead mechanical shutter 23b and the mechanical shutter 27b then go up to close the opening 23a and the opening 27a in the wall of the processing container 25, respectively. The wafer W is thus contained in the airtight processing container 25 in the airtight bulkhead 22 approximately horizontally with the surface to be processed facing up. After the bulkhead mechanical shutter 23b and the mechanical shutter 27b have gone up, or while they are going up, the inner cup 40 also moves to an elevated position (the position indicated by two-dot chain lines in FIG. 3).

Nitrogen, for example, is then supplied to the processing chamber 25a through the air holes 45 in the upper surface of the processing container 25. The nitrogen supplied to the processing chamber 25a produces an approximately uniform down flow in the processing chamber 25a.

The shutter 26b then opens, and the arm 54 is driven by the arm-driving mechanism (not shown in the figure) as soon as the mechanism has received a control signal from the pipeline control device 7 so that the arm 54 swings. The arm 54 thus moves from the waiting position (the position indicated by solid lines in FIG. 1) in which the arm 54 has been situated, to the processing position (the position indicated by two-dot chain lines in FIG. 1). As the arm 54 moves, the first to fourth processing nozzles 50a-50d supported by the end of the arm 54 enter into the processing chamber 25a from the arm container 25b and come above the wafer W to be processed, in approximately the center of the wafer W (see FIG. 3). Further, concurrently with this motion, the rotary cylinder 31 is rotary-driven by the hollow motor 34, and the wafer W is brought into the rotating state.

In this embodiment, the wafer W is then subjected to the process of cleaning consisting of four steps: cleaning with a chemical liquid, rinsing, cleaning with deionized water, and drying. While each step is performed, a rectified down flow is continuously produced in the processing chamber 25a. Further, in this embodiment, the process of removing droplets from the first to fourth processing nozzles 50a-50d and from the nozzle head 52 is performed in the arm container 25b in parallel with the step of drying the wafer W. These processes will be described in detail below.

First, the process of cleaning with a chemical liquid is performed as the first step. In this step, controlled by the pipeline control device 7, the fourth valve 57d opens, and a chemical liquid (e.g., a mixture of $NH_4$ and $H_2O_2$) is supplied as the processing liquid to the vicinity of the center of the surface of the rotating wafer W from the third processing nozzle 50c. The chemical liquid supplied to the wafer W surface then begins to flow on the wafer W from center to edge due to rotation of the wafer W (more specifically, the centrifugal force caused by the rotation of the wafer W), and the entire surface of the wafer W is thus cleaned with the chemical liquid.

Moreover, the chemical liquid supplied to the wafer W surface is scattered to the outside of the wafer W due to rotation of the wafer W. The scattered chemical liquid is guided by the slant 40a of the inner cup 40 in the elevated position and is exhausted through the first exhaust port 42 in the bottom of the processing container 25, the first exhaust port 42 being present on the inside of the inner cup 40. The chemical liquid discharged from the exhaust port 42 may be re-stored in the source 58c of the chemical liquid after properly treating this chemical liquid.

Controlled by the pipeline control device 7, the fourth valve 57d closes, by which discharge of the chemical liquid in the first step is completed, and the wafer processing proceeds to the second step.

Next, the second step, the process of rinsing, will be described. This step begins after the arm 54 has reached the processing position and the processing nozzles 50a-50d have come above the wafer W surface, in approximately the center of the wafer W. In this step, the wafer W remains rotated as in the first step. On the other hand, the inner cup 40 goes down when the second step begins.

First, controlled by the pipeline control device 7, the third valve 57c opens, and deionized water (DIW) is supplied as the processing liquid to the vicinity of the center of the surface of the rotating wafer W from the third processing nozzle 50c. As a result, the chemical liquid remaining on the wafer W is replaced with the deionized water. This state goes on for a certain period of time. Consequently, the chemical liquid supplied in the step of cleaning with the chemical liquid, still remaining in the third processing nozzle 50c, is also ejected from the third processing nozzle 50c along with the deionized water.

The third step, the process of cleaning the wafer W with deionized water by discharging (spouting, ejecting, jetting, blowing) a mixture of deionized water and a gas on the wafer W (AS process), will be described below.

This step begins as soon as the arm 54 has reached the processing position and the processing nozzles 50a-50d have come above the wafer W surface, in approximately the center of the wafer W. As in the first step, the wafer W remains rotated in this step.

In the third step, controlled by the pipeline control device 7, the first valve 57a and the second valve 57b open, and nitrogen and deionized water, the processing liquid, are supplied to the first processing nozzle 50a from the source 58a and the source 58b, respectively. As a result, the deionized water, the processing liquid, is mixed with the nitrogen in the first processing nozzle 50a, and the first processing nozzle 50a blows fine droplets of the deionized water on the wafer W together with the pressurized nitrogen, a carrier gas. Particles and the like can thus be removed from the wafer W at high efficiency of removal.

As soon as the first processing nozzle 50a begins to discharge the mixture of nitrogen and deionized water, the arm 54 is driven by the arm-driving mechanism. The first processing nozzle 50a thus horizontally moves above the wafer W surface from center to edge, while discharging the mixture of nitrogen and deionized water to the wafer W surface, whereby the entire surface of the wafer W is cleaned, to a high degree, with the mixture of nitrogen and deionized water.

The deionized water blown on the wafer W together with the nitrogen partly curls up above the wafer W and sticks to the processing nozzles 50a-50d, the nozzle head 52 supporting them, and so forth, as shown in FIG. 3. Further, the deionized water flows on the wafer W surface towards the edge and is eventually scattered from the wafer W surface to the outside. The scattered deionized water is guided by the slant 38a of the projection 38 on the inner wall of the processing container 25 and the slant 28a of the mechanical shutter 27b, and is exhausted through the second exhaust port 43 in the bottom of the processing container 25, the second exhaust port 43 being present on the outside of the inner cup 40.

Controlled by the pipeline control device 7, the first valve 57a and the second valve 57b close as soon as the first processing nozzle 50a have reached above the edge of the wafer W. The third step is thus completed, and the wafer processing proceeds to the fourth step.

In the fourth step, the wafer W held on the rotary holder 30 remains rotated for a certain period of time. The deionized water remaining on the wafer W surface is thus scattered to the outside, and the wafer W is dried. In this fourth step, the inner cup 40 is held in the downed position. Therefore, the deionized water scattered from the wafer W is exhausted through the second exhaust port 43.

Thus, a series of processes consisting of the above four steps and directly processed to the wafer W is completed. Upon completion of the wafer W processing, the rotary cylinder 31 stops rotating, and the wafer W comes to be held stationary on the rotary holder 30. The bulkhead mechanical shutter 23b and the mechanical shutter 27b then open, and the main wafer transferring unit 18 carries the processed wafer W out of the substrate processing system 20.

In the method of substrate processing in this embodiment, on the other hand, the process of removing droplets from the first to fourth processing nozzles 50a-50d and from the nozzle head 52 supporting the nozzles 50a-50d is performed in the arm container 25b in parallel with the process of drying the wafer W, as mentioned above. The process of removing droplets will be described below in detail.

Immediately after completion of the above-described process of cleaning the wafer W with deionized water (AS process), the arm 54 moves as is to the waiting position. That is to say, the first to fourth processing nozzles 50a-50d fixed to the nozzle head 52 on the arm 54 further horizontally move as they are to the horizontally outside of the wafer W, and the whole arm 54 including the first to fourth processing nozzles 50a-50d and the nozzle head 52 then moves to the arm container 25b from the processing chamber 25a. As soon as the arm 54 has reached the waiting position, the opening 27a is airtightly closed with the shutter 27b (see FIG. 2).

Controlled by the pipeline control device 7, the sixth valve 57f opens (see FIG. 4), and nitrogen is delivered from the source 58a to the groove 83 in the second block material 81. The nitrogen is discharged from the first droplet removing nozzle 60 and the second droplet removing nozzle 62 to the first to fourth processing nozzles 50a-50d and to the nozzle head 52 supporting them. Droplets sticking to the first to fourth processing nozzles 50a-50d and to the nozzle head 52, e.g., the deionized water that has been discharged from the first nozzle 50a, curled up between the nozzle head 52 and the wafer W, and stuck to the first to fourth processing nozzles 50a-50d and to the nozzle head 52 in the above-described process of cleaning with deionized water (AS process), can thus be removed from the first to fourth processing nozzles 50a-50d and from the nozzle head 52.

In this embodiment, the first droplet removing nozzle 60 is situated on one side of the first to fourth processing nozzles 50a-50d supported by the arm 54 that is in the waiting position, and the second droplet removing nozzle 62 is situated on the other side, opposite to the one side across the first to fourth processing nozzles 50a-50d fixed to the nozzle head 52 supported by the arm 54, of the first to fourth processing nozzles 50a-50d supported by the arm 54 that is in the waiting position, as shown in FIGS. 5 and 6. Therefore, the droplets removed from the first to fourth processing nozzles 50a-50d and from the nozzle head 52 are blown away downwardly between the directions in which nitrogen is jetted from the first droplet removing nozzle 60 and the second droplet removing nozzle 62.

Further, the first receiver 77 is so placed that the first receiver 77 is under the first processing nozzle 50a when the arm 54 is in the waiting position, and the second receiver 78 is so placed that the second receiver 78 is below the second to fourth processing nozzles 50b-50d when the arm 54 is in the waiting position, as shown in FIG. 5. Therefore, droplets falling from the first processing nozzle 50a are mostly collected in the first receiver 77, and droplets falling from the second to fourth processing nozzles 50b-50d are mostly collected in the second receiver 78. The liquid collected in the first receiver 77 is delivered to the first collection container 79a through the first droplet exhaust passage 77a. The liquid collected in the second receiver 78 is delivered to the second collection container 79b through the second droplet exhaust passage 77b.

Further, the second block material 81 is so situated that the second block material 81 is below the nozzle head 52 when the arm 54 is in the waiting position, as shown in FIG. 5. Droplets falling from the nozzle head 52 therefore are mostly collected on the second block material 81. That is to say, the droplets removed from the first to fourth processing nozzles 50a-50d and from the nozzle head 52 are blown away to almost the same part of the substrate processing system 20. It is thus possible to prevent the processing liquid from being blown away to unexpected parts of the substrate processing system 20 to allow deterioration of the system.

Furthermore, the first block material 71 functions as an enclosure 64 by which the space below the first to fourth processing nozzles 50a-50d fixed to the nozzle head 52 on the arm 54 that is in the waiting position is surrounded on three sides, as mentioned above. Therefore, droplets sticking to the first to fourth processing nozzles 50a-50d and to the nozzle head 52 can be effectively prevented from being blown away to the outside of the second block material 81. It is thus possible to prevent more effectively deterioration of the substrate processing system 20 whose cause is scattering of the processing liquid to unexpected parts.

Discharging nitrogen from the first droplet removing nozzle 60 and the second droplet removing nozzle 62 in the process of removing droplets stops as soon as the sixth valve 57f, controlled by the pipeline control device 7, closes so as to complete the process of removing droplets.

Completion of the above-described process of removing droplets and completion of the previously-mentioned steps of drying the wafer W and of carrying the dried wafer W out of the substrate processing system 20 mean completion of processing of one wafer W using the substrate processing system 20. After this, a wafer W to be processed next is carried in the substrate processing system 20, and the aforementioned procedure is repeated. At the beginning of processing of the next wafer, droplets of the processing liquid are present neither on the nozzle head 52 nor on the first to fourth processing nozzles 50a-50d supported by the nozzle head 52. It is therefore possible to avoid dripping of the processing liquid on the surface of a wafer W to be processed next while the art 54 is pivoting, for example.

According to the above embodiment, droplets sticking to the processing nozzles 50a-50d and droplets sticking to the surrounding of the processing nozzles 50a-50d can be removed from them by blowing a gas to the processing nozzles 50a-50d from the first droplet removing nozzle 60 and the second droplet removing nozzle 62.

Therefore, the processing liquid can be prevented from dripping on a wafer W even when a two-fluid nozzle, to which droplets of a processing liquid tend to stick, is used as the processing nozzle. Further, since the processing nozzles 50a-50d are on the outside of the wafer W while droplets are removed, the removed droplets can be prevented from falling on the wafer W. It is thus possible to prevent occurrence of water marks on the wafer W whose cause is dripping of the processing liquid.

Further, according to this embodiment, the first droplet removing nozzle 60 is placed on one side of the path A along which the processing nozzles move as the arm 54 approaches the waiting position, and second the droplet removing nozzle 62 on the other side of the path A. Therefore, droplets sticking to the processing nozzles 50a-50d and droplets sticking to their surrounding can be blown away downward. Moreover, the first droplet removing nozzle 60 and the second droplet removing nozzle 62 can be placed in the vicinity of the processing nozzles 50a-50d, while the processing nozzles 50a-50d do not come into contact with the droplet removing nozzles 60, 62 when the processing nozzles 50a-50d move as the arm 54 swings. That is to say, it is possible to remove the droplets with higher certainty while preventing production of undesired particles or the like by avoiding contact between the movable members.

Furthermore, according to this embodiment, the substrate processing system 20 has the enclosure 64 by which the space below the processing nozzles 50a-50d supported by the arm 54 that is in the waiting position is surrounded on three sides that correspond to both sides of the path A along which the processing nozzles move as the arm 54 approaches the waiting position and to the front side of the path A. It is therefore possible to collect the removed droplets in an area enclosed in the enclosure 64. Consequently, the removed droplets can be prevented from being scattered to unexpected parts in the substrate processing system 20. It is thus possible to prolong effectively the life of the substrate processing system 20 and to decrease significantly the cost and work needed to maintain the substrate processing system 20.

It should be understood that the aforementioned embodiment be susceptible to various modifications without departing from the scope of the invention.

For example, in the above-described embodiment, the arm 54 swings about the pivot axis L2 and moves between the waiting position and the processing position, whereby the first to fourth processing nozzles 50a-50d fixed to the nozzle head 52 on the end of the arm 54 move. However, the present invention is not limited to this embodiment. For example, the arm 54 may be movable in a plane parallel to the plate surface of a wafer W held on the rotary holder 30, in two directions crossing each other at an angle or right angle.

Further, although the first to fourth processing nozzles 50a-50d are supported by the arm 54 in the aforementioned embodiment, the structure of the processing nozzles to be supported by the arm 54 can be changed, as needed. For example, the number of the processing nozzles (at least one) to be supported by the arm 54 may be designed freely. Moreover, the type of the fluid to be discharged from each processing nozzle, such as gas, liquid, or gas-liquid binary fluid, may be changed when necessary.

Furthermore, in the above-described embodiment, a two-fluid nozzle is used as the processing nozzle to discharge the processing liquid in the state of fine droplets. However, the present invention is not limited to this. A single fluid spray nozzle may be used as any of the processing nozzles 50a-50d to discharge the processing liquid. Moreover, an ultrasonic nozzle (ultrasonic fluid nozzle) may also be used as any of the processing nozzles 50a-50d to discharge the processing liquid.

Furthermore, in the aforementioned embodiment, the first droplet removing nozzle 60 and the droplet removing nozzle 62 are made with the first block material 71 and the second block material 81. The present invention is not limited to this. Known nozzles can be used as the droplet removing nozzles. Furthermore, in the above-described embodiment, the droplet removing nozzles 60, 62 have the blow-off openings 60a, 62a that are long and narrow. The present invention is not limited to this, and the droplet removing nozzles can have known blow-off openings.

Figure 9:
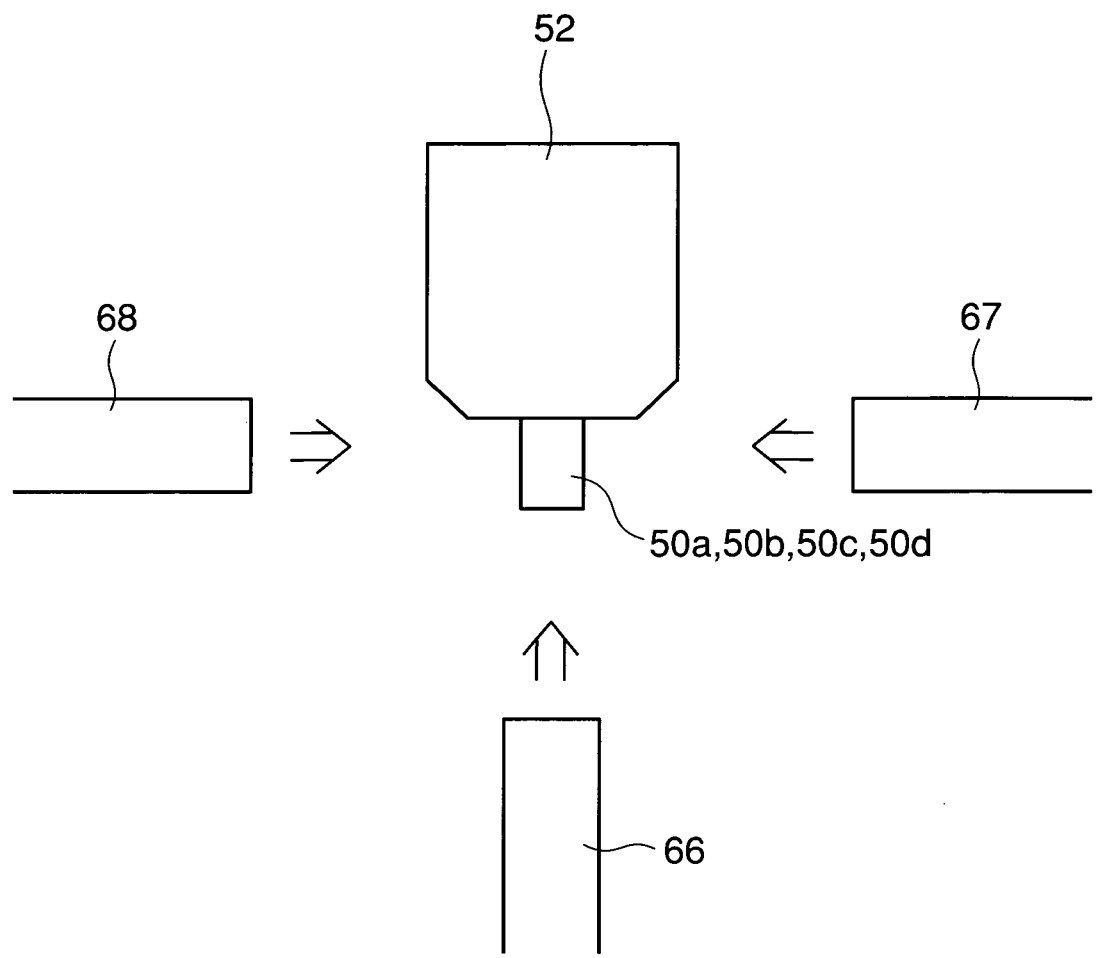
FIG. 9 is a view similar to that of FIG. 6 and illustrates modified droplet removing nozzles.

Furthermore, in the aforementioned embodiment, the first droplet removing nozzle 60 and the second droplet removing nozzle 62 are situated below the processing nozzles 50a-50d, and the first droplet removing nozzle 60 and the second droplet removing nozzle 62 are positioned on the both sides, respectively, of the path A along which the processing nozzles 50a-50d move as the arm approaches the waiting position. For example, a droplet removing nozzle 66 may be placed right under the processing nozzles 50a-50d so as to blow vertically from below a gas to the processing nozzles 50a-50d, as shown in FIG. 9. Moreover, a droplet removing nozzle 67 may be placed on one side of the processing nozzles 50a-50d so that the droplet removing nozzle 67 is horizontally apart from the processing nozzles 50a-50d, and a droplet removing nozzle 68 may be placed on the other side of the processing nozzles 50a-50d so that the droplet removing nozzle 68 is horizontally apart from the processing nozzles 50a-50d, thereby blowing a gas to the processing nozzles 50a-50d from two sides horizontally apart from each other, as shown in FIG. 9. FIG. 9 is a view similar to that of FIG. 6 and illustrates modified droplet removing nozzles. In FIG. 9, like parts to those in the above embodiment shown in FIGS. 1 to 8 will be denoted by like numerals, respectively, and their duplicated details are omitted.

Furthermore, in the above-described embodiment, the space below the processing nozzles 50a-50d supported by the arm 54 that is in the waiting position is surrounded by the enclosure 64 on three sides, and the droplets removed from the processing nozzles 50a-50d are guided by the enclosure 64. The present invention, however, is not limited to this. For example, the enclosure 64 may be composed only of the side part 64a situated on one side of the processing nozzles 50a-50d supported by the arm 54 that is in the waiting position and the side part 64b situated on the other side, opposite to the one side, of the processing nozzles 50a-50d, without the front part 64c, and the space below the processing nozzles 50a-50d supported by the arm 54 that is in the waiting position may be surrounded by the enclosure 64 only on two sides.

Figure 10:
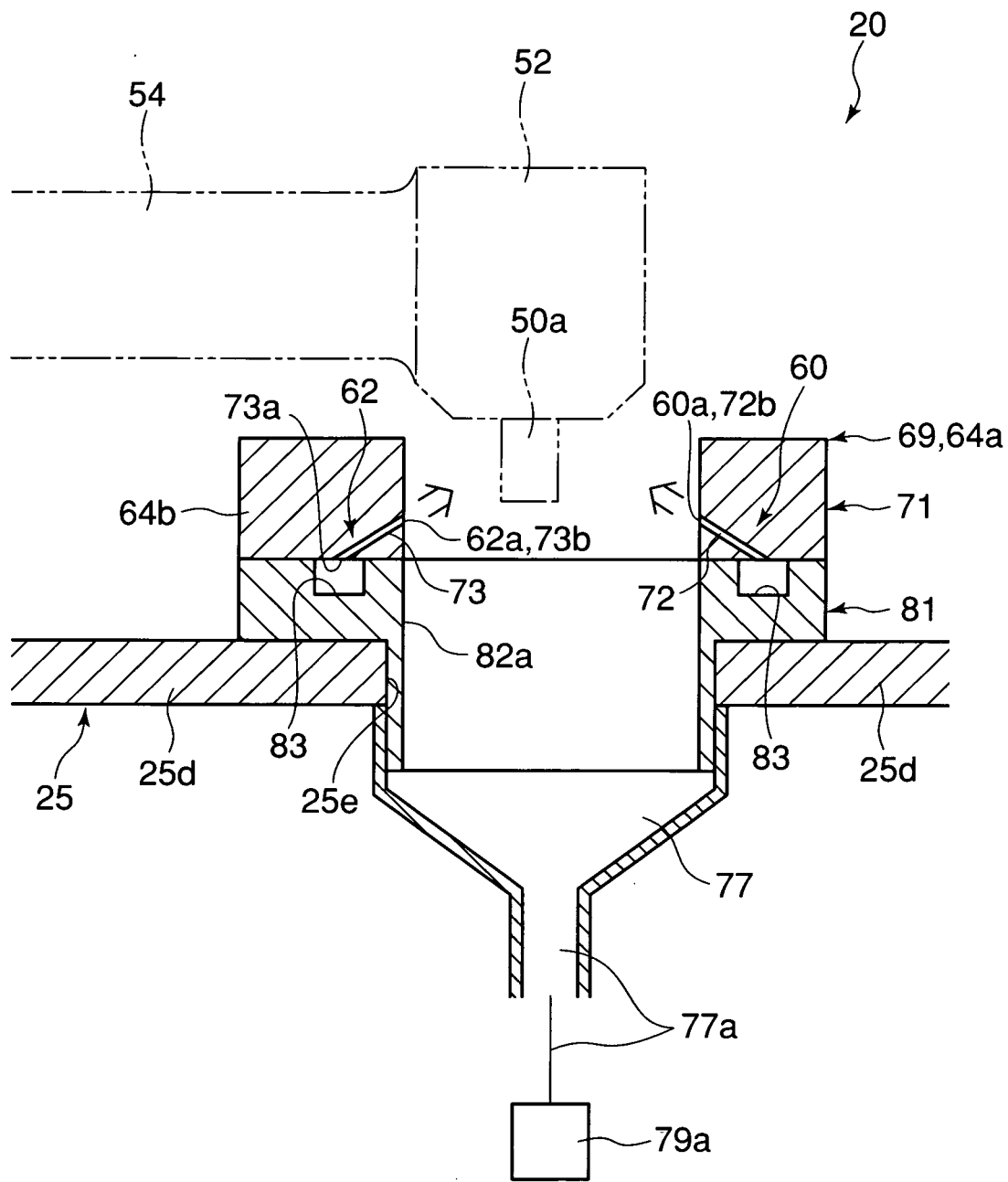
FIG. 10 is a view similar to that of FIG. 6 and illustrates a modified enclosure.

Further, for example, not only the space below the processing nozzles 50a-50d supported by the arm 54 that is in the waiting position but also at least a part of the processing nozzles 50a-50d supported by the arm 54 that is in the waiting position may be surrounded by the enclosure 64, as shown in FIG. 10. FIG. 10 is a view similar to that of FIG. 6 and illustrates a modified enclosure. According to such a modification, the droplets removed from the processing nozzles 50a-50d can be collected in an area enclosed in the enclosure 69 with higher certainty. It is therefore possible to prevent more effectively the removed droplets from being scattered to unexpected parts in the substrate processing system 20. Further, by positioning the side part 64a on one side of the path A along which the processing nozzles move as the arm 54 approaches the waiting position and the side part 64b on the other side of the path A, it is possible to prevent the processing nozzles 50a-50d and the side parts 64a, 64b from coming into contact with each other while the arm 54 is pivoting. Moreover, the side parts 64a, 64b can be positioned in the vicinity of the processing nozzles 50a-50d. That is to say, it is possible to remove droplets with higher certainty while preventing production of undesired particles or the like by avoiding contact between the movable members.

FIG. 10 shows a case where the processing nozzles 50a-50d are partly surrounded by the first block material 71 having an increased thickness. The structure of the enclosure 64 in this embodiment is not limited to the one shown in the figure. In FIG. 10, like parts to those in the above embodiment shown in FIGS. 1 to 8 will be denoted by like numerals, respectively, and their duplicated details are omitted.

Figure 11:
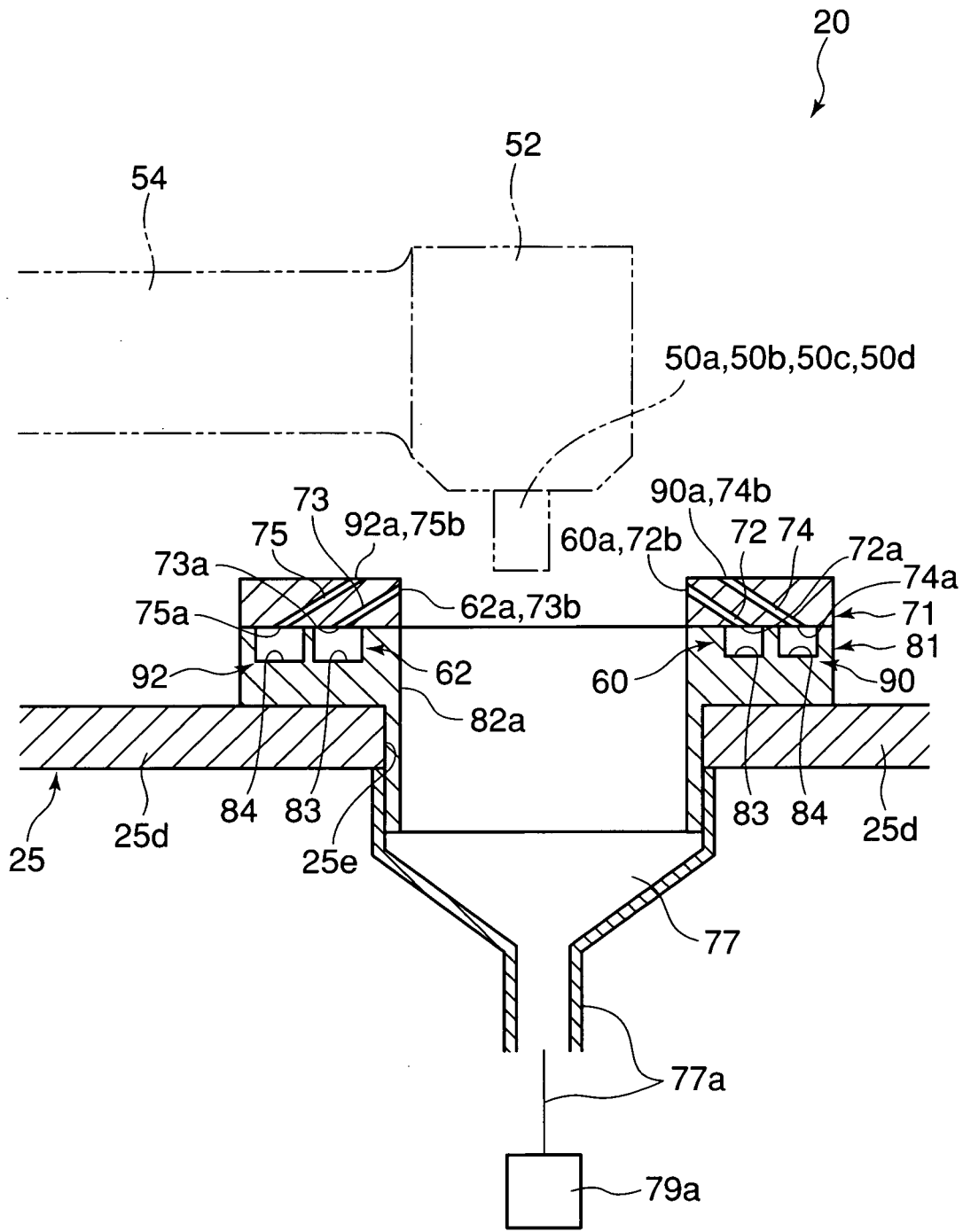
FIG. 11 is a view similar to that of FIG. 6 and illustrates a modified nozzle capable of discharging deionized water.

The aforementioned substrate processing system 20 can further comprise nozzles 90, 92 capable of discharging deionized water to the processing nozzles 50a-50d, which are placed so that the nozzles 90, 92 are in the vicinity of the processing nozzles 50a-50d when the arm 54 is in the waiting position. Such a modification is shown in FIG. 11. FIG. 11 is a view similar to that of FIG. 6 and shows the modification including the nozzles for discharging deionized water. In FIG. 11, like parts to those in the above embodiment shown in FIGS. 1 to 8 will be denoted by like numerals, respectively, and their duplicated details are omitted.

In the case shown in FIG. 11, the deionized water discharging nozzles (water-discharging nozzles) 90, 92 having the same structure as that of the above-described droplet removing nozzles 60, 62 are situated in the vicinity of the droplet removing nozzles 60, 62. That is to say, the first deionized water discharging nozzle 90 is situated on one side of the path A along which the processing nozzles move as the arm 54 approaches the waiting position, and the second deionized water discharging nozzle 92 is situated on the other side of the path A. These two nozzles 90, 92 have discharging openings (blow-off openings) 90a, 92a extending along the path A along which the processing nozzles move, respectively. Specifically, the second block material 81 has a second groove 84 communicating with the source of deionized water. Further, the first block material 71 has a second slot 74 on one side and a second slot 75 on the other side, one ends 74a, 75a of the second slots 74, 75 facing the groove 84 in the second block material 81, the other ends 74b, 75b being directed to the processing nozzles 50a-50d.

When the substrate processing system 20 shown in FIG. 11 is used, the step of discharging deionized water to the processing nozzles 50a-50d and on the nozzle head 52 from the first and second deionized water discharging nozzles 90, 92 may be performed prior to the step of discharging a gas from the first and second droplet removing nozzles 60, 62 in the above-described process of removing droplets.

Further, in the aforementioned embodiment, the third processing nozzle 50c is connected to the source of a chemical liquid 58c and to the source of deionized water 58b, and is used to supply a chemical liquid in the step of cleaning with a chemical liquid and also used to supply deionized water in the rinsing step. The present invention is not limited to this, and the chemical liquid and deionized water may be supplied through other processing nozzle.

In the above case, the process of removing droplets may be performed in the following manner: after the process of cleaning with a chemical liquid, the arm 54 is once returned to the waiting position, and droplets are then removed in the arm container 25b isolated from the processing chamber 25b. Further, as in the modification as described above with reference to FIG. 11, it is preferable to set, before the process of removing droplets, the step of discharging deionized water to the processing nozzles 50a-50d and on the nozzle head 52 from the first deionized water discharging nozzle 90 and the second deionized water discharging nozzle 92. By doing so, a chemical liquid that causes strong chemical reactions can be removed from the processing nozzles 50a-50d and from the nozzle head 52, and can thus be prevented from dripping on a wafer W, or from being scattered to unexpected parts of the substrate processing system 20.

Furthermore, in the above-described embodiment, a wafer W is dried by rotating the wafer W in the fourth step in the process of cleaning. The present invention is not limited to this. For example, in the fourth step, the fourth processing nozzle 50d may be made to move horizontally above the wafer W from center to edge, while discharging nitrogen, as the arm 54 swings. In this case, the wafer W may be made to continue rotating for a while even after the arm 54 has pivoted until the fourth processing nozzle 50d comes horizontally outside the wafer W, and after the fourth processing nozzle 50d has stopped discharging nitrogen. In such a case, the above-described process of removing droplets may be started after the fourth processing nozzle 50d has stopped discharging nitrogen and after the arm 54 has moved to the waiting position.

Furthermore, in the aforementioned embodiment, a gas is jetted from the droplet removing nozzles 60, 62 after the arm 54 has reached the waiting position. The present invention is not limited to this. The step of positioning the arm 54 to the waiting position and the step of removing droplets may be performed in parallel. The first droplet removing nozzle 60 is placed on one side of the path A along which the processing nozzles move as the arm 54 approaches the waiting position, and the second droplet removing nozzle 62 is situated on the other side of the path A, and moreover, the first and second droplet removing nozzles 60, 62 have the blow-off openings 60a, 62a extending along the path A, respectively. It is therefore possible to remove effectively droplets from the processing nozzles 50a-50d and from the nozzle head 52 while the arm 54 is moving. Even in such a modification, since the enclosure 64 has the blow-off openings 60a, 62a in its side surfaces, the removed droplets are blown away only in the enclosure 64 and can thus be prevented from being scattered to other parts of the substrate processing system 20 or on the surface of a wafer W.

Some modifications of the aforementioned embodiment of the substrate processing system, of the method of substrate processing, of the program, and of the storage medium have been described. It is, of course, possible to employ two or more of the modifications in combination.

In the meantime, the substrate processing system 20 comprises the control device 5 including a computer, as mentioned above. The control device 5 operates the component elements of the substrate processing system 20 so as to perform the steps included in the method of wafer W processing. A storage medium 6 on which is stored a program for cleaning a wafer W by the use of the substrate cleaning system 20, that can be read with and is run by the computer included in the control device 5, is also an object of the present invention. The storage medium 6 herein includes not only single objects such as flexible discs and hard disc drives, but also networks for transmitting various signals.

In the above description, the substrate processing system according to the present invention is applied to the wafer W cleaning system. The present invention is not limited to this, and the substrate processing system of the invention may be applied to processes of cleaning and drying LCD or CD substrates. Moreover, it can also be applied to systems to be used to perform a variety of processes other than the process of cleaning.

The invention claimed is:

1. A substrate processing system comprising:
 a processing nozzle capable of supplying a processing liquid to a substrate to be processed;
 a nozzle head to which the processing nozzle is fixed;
 an arm supporting the nozzle head processing nozzle, the arm being movable between a processing position and a waiting position, the processing nozzle being above the substrate when the arm is in the processing position and being outside the substrate when the arm is in the waiting position;
 a nozzle capable of blowing a gas to exterior surfaces of the processing nozzle and the nozzle head, the gas blowing nozzle stationarily located in the vicinity of the waiting position and positioned to remove droplets from the surface;
 a receiver that catches droplets falling from the processing nozzle, the receiver being so situated that the receiver is below the processing nozzle when the arm is in the waiting position;
 an exhaust passage communicating with the receiver, through which the droplets collected in the receiver are exhausted from the receiver;
 an enclosure by which a space below the processing nozzle supported by the arm that is in the waiting position is surrounded on three sides that correspond to both sides of a path along which the processing nozzle and the nozzle head move as the arm approaches the waiting position and to the front side of the path,
 wherein when the arm moves between the processing position and the waiting position, the processing nozzle and the nozzle head move in the path parallel to a horizontal plane containing the substrate, and
 wherein the gas blowing nozzle is stationarily situated on each side of the path along which the processing nozzle and the nozzle head move as the arm approaches the waiting position, and the gas blowing nozzle comprises a groove and slots which form a gas path to the gas blowing nozzle and the gas blowing nozzle extends longitudinally from the waiting position along the path on which the processing nozzle and the nozzle head move as the arm approaches the waiting position.

2. The substrate processing system according to claim 1, wherein the processing nozzle is a two-fluid nozzle that produces a mixture of the processing liquid and a gas and discharges the mixture.

3. The substrate processing system according to claim 1, wherein the gas-blowing nozzle is situated below the processing nozzle.

4. The substrate processing system according to claim 1, further comprising an enclosure by which a space below the processing nozzle supported by the arm that is in the waiting position is surrounded on three sides that correspond to both sides of a path along which the processing nozzle moves as the arm approaches the waiting position and to the front side of the path.

5. The substrate processing system according to claim 1, wherein the blow-off opening of the gas-blowing nozzle is located in a side of the enclosure facing the space below the processing nozzle.

6. The substrate processing system according to claim 1, further comprising a nozzle capable of discharging water to the processing nozzle, the water-discharging nozzle being so situated that the water-discharging nozzle is in the vicinity of the processing nozzle when the arm is in the waiting position.

* * * * *